United States Patent
Omata et al.

(10) Patent No.: US 9,281,938 B2
(45) Date of Patent: Mar. 8, 2016

(54) WIRELESS COMMUNICATION DEVICE, WIRELESS COMMUNICATION SYSTEM, AND RECEIVING CIRCUIT

(71) Applicants: Junichi Omata, Tokyo (JP); Eizaburo Morishita, Tokyo (JP)

(72) Inventors: Junichi Omata, Tokyo (JP); Eizaburo Morishita, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/623,923

(22) Filed: Feb. 17, 2015

(65) Prior Publication Data

US 2015/0256331 A1 Sep. 10, 2015

(30) Foreign Application Priority Data

Mar. 4, 2014 (JP) .................................. 2014-041320

(51) Int. Cl.
*H03D 3/24* (2006.01)
*H04L 7/033* (2006.01)

(52) U.S. Cl.
CPC ..................................... *H04L 7/0331* (2013.01)

(58) Field of Classification Search
CPC ..... H04L 7/033; H04L 7/0337; H04L 7/0331; H04L 7/0338; H04L 7/0008; H04L 7/02; H03L 7/0891; H03L 7/093; H03L 7/087; H03L 7/18; H03L 7/0814
USPC .......... 375/376, 373, 362, 354, 316, 295, 219
See application file for complete search history.

(56) References Cited

U.S. PATENT DOCUMENTS

| | | | |
|---|---|---|---|
| 7,095,274 B2 | 8/2006 | Lopez Villegas et al. | |
| 2005/0105633 A1 | 5/2005 | Lopez Villegas et al. | |
| 2005/0219120 A1* | 10/2005 | Chang | 342/357.13 |
| 2009/0267664 A1* | 10/2009 | Uozumi et al. | 327/158 |
| 2012/0224407 A1* | 9/2012 | Aleksic et al. | 365/129 |
| 2013/0195157 A1* | 8/2013 | Xu | 375/219 |

FOREIGN PATENT DOCUMENTS

JP 2005-521298 7/2005

* cited by examiner

*Primary Examiner* — Zewdu Kassa
(74) *Attorney, Agent, or Firm* — IPUSA, PLLC

(57) ABSTRACT

A wireless communication device includes a first injection locked oscillator that inputs a received signal and includes a free-running frequency obtained by offsetting a frequency on a plus side relative to a half frequency of a frequency of the received signal; a second injection locked oscillator that inputs the received signal and includes a free-running frequency obtained by offsetting a frequency on a minus side relative to the half frequency of a frequency of the received signal; a phase difference detecting unit that detects a phase difference between an output signal output from the first injection locked oscillator and an output signal output from the second injection locked oscillator; a baseband processing unit that extracts a receiving frame based on the detected phase difference; and an access controlling unit that performs a medium access control based on the receiving frame.

7 Claims, 10 Drawing Sheets

WIRELESS COMMUNICATION DEVICE, WIRELESS COMMUNICATION SYSTEM, AND RECEIVING CIRCUIT

CROSS-REFERENCE TO RELATED APPLICATIONS

This patent application is based upon and claims the benefit of priority of Japanese Patent Application No. 2014-041320 filed on Mar. 4, 2014, the entire contents of which are incorporated herein by reference.

BACKGROUND OF THE INVENTION

1. Field of the Invention

The present invention relates to a wireless communication device, a wireless communication system, and a receiving circuit.

2. Description of the Related Art

An example of a receiver for a wireless local area network adopts a direct conversion method or a sliding IF (Intermediate Frequency) for downsizing or a low-power consumption.

Figure 9A:
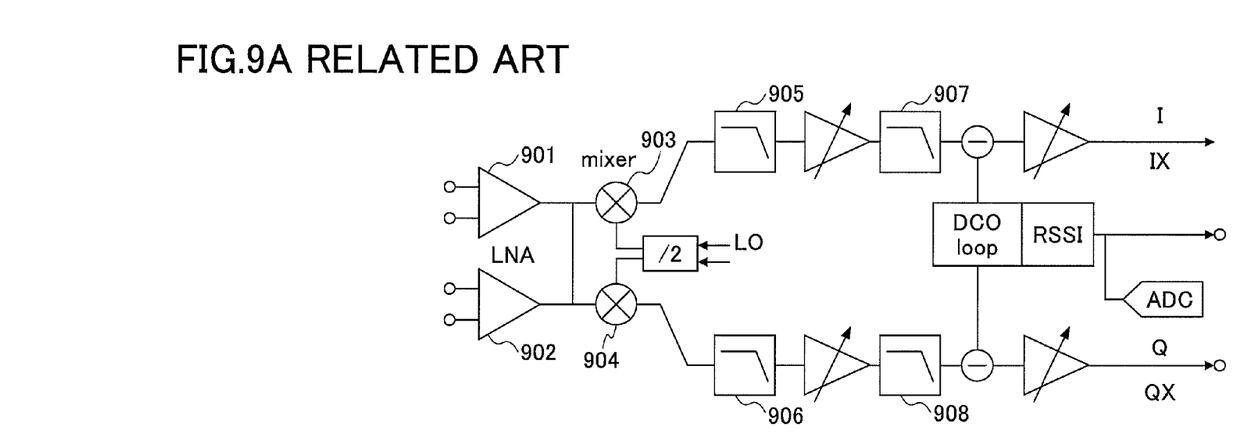
FIG. 9A illustrates an exemplary structure of a wireless LAN receiver.

FIG. 9A illustrates an exemplary structure of the receiver of the direct conversion method. The down conversion method down-converts a local signal having the same frequency (for example, 2.4 GHz) as that of a carrier signal and demodulates to a baseband signal.

Figure 9B:
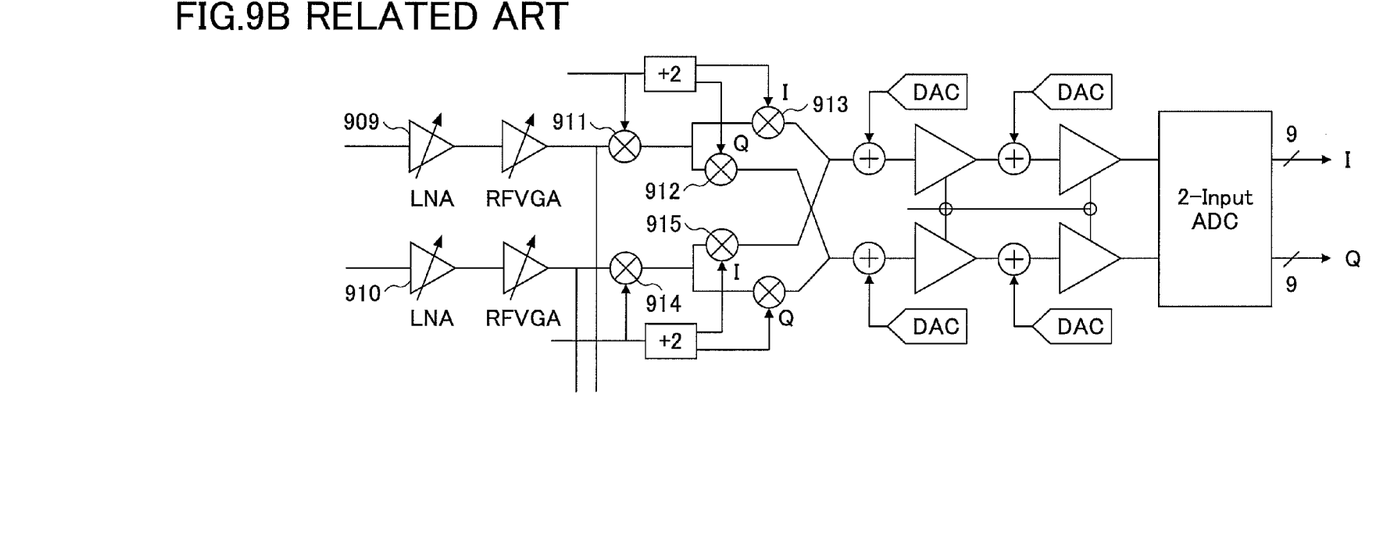
FIG. 9B illustrates an exemplary structure of another wireless LAN receiver.

FIG. 9B illustrates an exemplary structure of the receiver of the sliding IF method. The sliding IF method down-converting a local signal having a frequency two thirds of the frequency of a carrier signal, and thereafter down-converts a local signal having a half frequency of the frequency of the above local signal having the frequency two thirds of the frequency of the carrier signal, and demodulates to a baseband signal.

In both of the above methods, a phase locked loop (PLL) circuit or the like as a local signal source is necessary. A voltage controlled oscillator (VCO) included in the PLL circuit ordinarily has a structure where a LC oscillator having an inductor is used in a GHz band. Because the size of the inductor is large, a VCO having an oscillating frequency higher than the carrier frequency may be used for downsizing and a lower cost. However, there is a limit in the downsizing and the low-power consumption.

Further, in the example of FIGS. 9A and 9B, many components such as low noise amplifiers (LNA) 901, 902, 909, and 910, mixers 903, 904, 911, 912, 913, and 914 for converting the frequency, and filters 905, 906, 907, and 908 are necessary.

Meanwhile, there is known a technique wherein a phase shift keying (PSK) modulation is converted to an amplitude shift keying (ASK) modulation using an argument divider (see, for example, Japanese National Publication of International Patent Application No. 2005-521298). Further, there is known a technique wherein the argument divider such as an injection locked oscillator (ILO) and an analog multiplier are used to convert from a signal subjected to the PSK modulation to a baseband signal (see, for example, U.S. Pat. No. 7,095,274). An exemplary block chart of a binary phase shift keying (BPSK) modulation is illustrated in FIG. 10.

Figure 10:
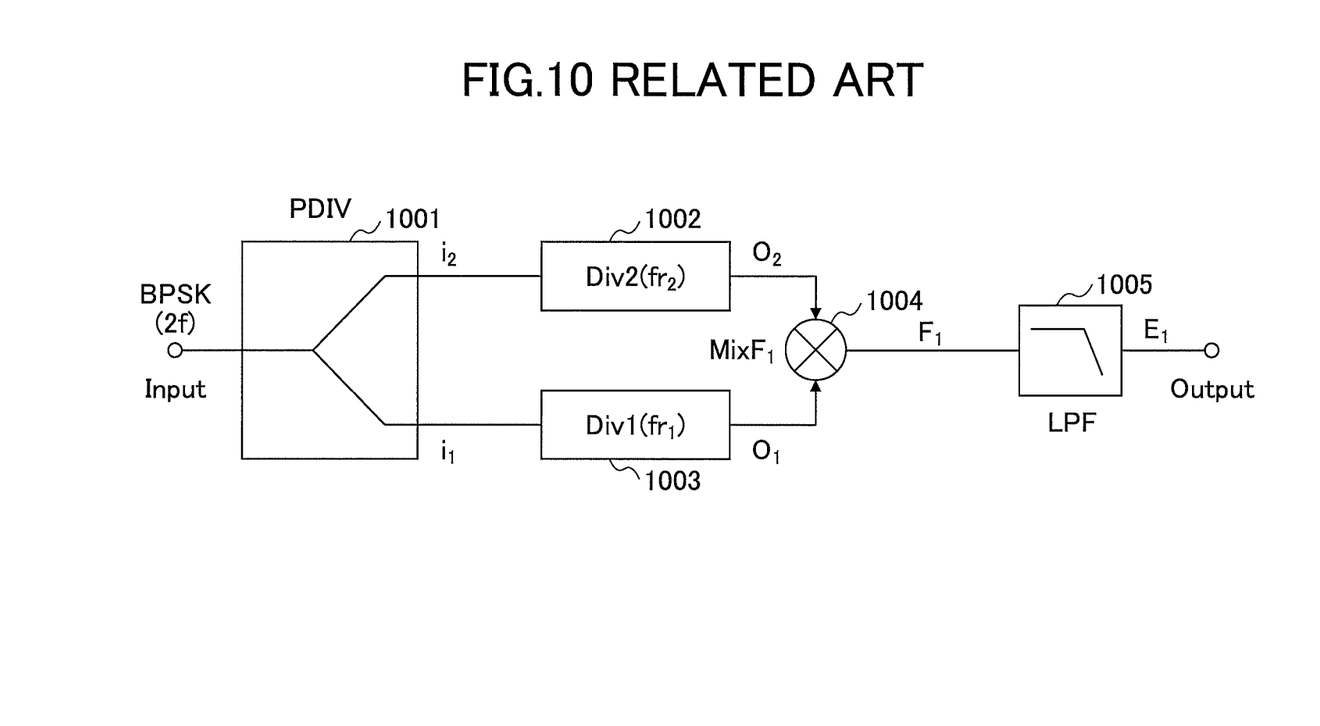
FIG. 10 illustrates an exemplary receiving circuit.

Referring to FIG. 10, a received signal having a frequency $2f$ and subjected to the BPSK modulation is divided into two signals by an electric power distribution device 1001 and the divided signals are input into argument dividers 1002 and 1003 such as an ILO. The argument dividers 1002 and 1003 output a signal having a frequency $f$ being a half frequency of the frequency of the received signal when the received signal is input. Further, the phase of the output signal of the argument divider 1003 is changed so as to increase by a phase of 90 degrees when the phase of the received signal subjected to the BPSK modulation advances by 180 degrees. On the other hand, the phase of the output signal of the argument divider 1003 is changed so as to decrease by a phase of 90 degrees when the phase of the received signal subjected to the BPSK modulation advances by 180 degrees. Output signals of the argument dividers 1002 and 1003 are multiplied by the analog multiplier (a mixer) 1004 and caused to pass through a lowpass filter 1005 to form an output signal. In the example of FIG. 10 also, the mixer (the analog multiplier 1004) and the filter (the lowpass filter 1005) are included in a receiving circuit.

By the structure illustrated in FIG. 10, the number of parts of the receiver can be decreased. However, an ordinary wireless LAN device needs to deal with multiple modulation methods such as direct sequence spread spectrum (DSSS) or orthogonal frequency division multiplexing (OFDM). Therefore, the demodulation circuit disclosed in U.S. Pat. No. 7,095,274 is limited to a use for demodulation of BPSK and is not used for an ordinary wireless LAN device.

By the downsizing and the low-power consumption in the wireless LAN device, a versatile technique of the wireless LAN can be utilized in various fields. However, because a conventional wireless LAN device has a structure including multiple mixers, multiple filters, and so on, there is difficulty to attain the downsizing or the low-power consumption.

SUMMARY OF THE INVENTION

Accordingly, embodiments of the present invention may provide a novel and useful wireless communication device solving one or more of the problems discussed above.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

More specifically, the embodiments of the present invention may provide a wireless communication device including a first injection locked oscillator that inputs a received signal and includes a free-running frequency obtained by offsetting a frequency on a plus side relative to a half frequency of a frequency of the received signal; a second injection locked oscillator that inputs the received signal and includes a free-running frequency obtained by offsetting a frequency on a minus side relative to the half frequency of a frequency of the received signal; a phase difference detecting unit that detects a phase difference between an output signal output from the first injection locked oscillator and an output signal output from the second injection locked oscillator; a baseband processing unit that extracts a receiving frame based on the detected phase difference; and an access controlling unit that performs a medium access control based on the receiving frame.

DETAILED DESCRIPTION OF EMBODIMENTS

A description of embodiments of the present invention is given below, with reference to the FIG. 1 through FIG. 8.

The embodiments described below are only examples and the present invention is not limited to the embodiments.

Through all figures illustrating the embodiments, the same references symbols are used for portions having the same function, and repetitive explanations of these portions are omitted.

Reference symbols typically designate as follows:
300: wireless LAN device (wireless communication device);
401: first injection locked oscillator (ILO);
402: second injection locked oscillator (ILO);
403: first time-to-digital converter (TDC);
404: second time-to-digital converter (TDC);
405: exclusive-or circuit (XOR);
418: phase difference detecting unit;
801: baseband processing unit;
802: media access control (MAC) processing unit (access controlling unit).
<System Structure>
(Radio Control Toy System)

Figure 1:
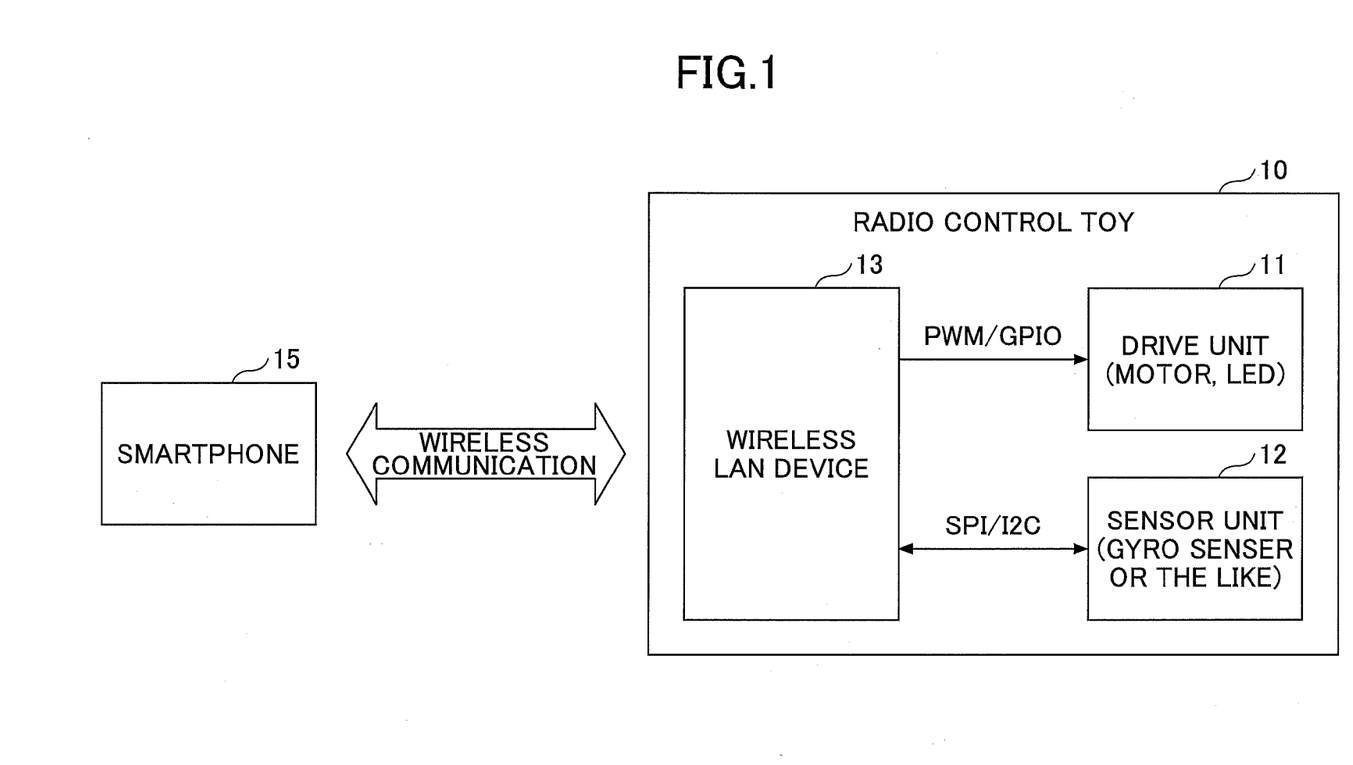
FIG. 1 is a block chart illustrating an embodiment of a radio control toy system.

FIG. 1 is a block chart illustrating an embodiment of a radio control toy system using a wireless LAN device 13 being a wireless communication device of an embodiment of the present invention. Referring to FIG. 1, the radio control toy 10 is a toy of, for example, a helicopter or an automobile. The radio control toy 10 includes a drive unit 11 including a motor and a LED, a sensor unit 12 such as a gyro sensor or a speed sensor, and a wireless LAN device 13.

The wireless LAN device 13 is connected with, for example, a smartphone 15 through wireless LAN communication. The smartphone 15 is used as a remote controller. An operation command given by the smartphone is sent to the wireless LAN device 13 through the wireless LAN communication. The wireless LAN device 13 generates a control signal based on the above operation command and supplies the generated control signal to the drive unit 11. The control signal is a pulse width modulation (PWM) signal or a general purpose input/output (GPIO) signal.

Detection signals output by sensors in the sensor unit 12 are supplied to the wireless LAN device 13 through a serial peripheral interface (SPI), an inter-integrated circuit (I2C), or the like, and supplied from the wireless LAN device 13 to the smartphone 15 through the wireless LAN. States such as the posture, the speed or the like are displayed by the smartphone 15.

Referring to FIG. 1, the radio control toy 10 can be operated as an access point and also operated in an independent basic service set (IBSS), which as an ad hoc mode of the wireless LAN.

In a case where the radio control toy 10 performs an IBSS operation, an IBSS connection between the radio control toy 10 and the smartphone 15 is performed according to, for example, the following procedure.

1) Forming an IBSS network: Referring to FIG. 1, when a power switch of the radio control toy 10 is turned on, the mode of the wireless LAN device 13 becomes an intermittent sending and receiving mode and the wireless LAN device 13 sends a beacon frame (hereinafter, simply referred to as a "beacon").

2) Participating in the IBSS network: The smartphone 15 receives the beacon sent by the wireless LAN device 13 and connects itself to the IBSS network of the wireless LAN device 13. The wireless LAN device 13 detects the connection of smartphone 15 and transits from the intermittent sending and receiving mode to a steady sending and receiving mode performing a steady sending and receiving process and maintains the steady sending and receiving mode.

3) Preparing data communication: The smartphone 15 sets an IP address. At this time, the wireless LAN device 13 functions as a dynamic host configuration protocol (DHCP) server and the smartphone 15 acquires a MAC address of the wireless LAN device 13.

4) Data communication: Operations of the motor and the LED of the drive unit 11 are controlled by an operation command from the smartphone 15.

5) Disconnection: When the beacon is not received from the smartphone 15 for a predetermined time of period, the wireless LAN device 13 transits to the intermittent sending and receiving mode.

Further, in a case where the radio control toy 10 is operated as an access point, after a power switch of the radio control toy 10 is turned on, the wireless LAN device 13 starts sending the beacon with a predetermined cycle. After the smartphone 15 is connected to the radio control toy 10 with the wireless LAN connection in a procedure similar to a case where the smartphone 15 is connected to an ordinary access point, it becomes possible to operate the radio control toy 10.

The above structure realizes a wireless communication system performing a remote operation of an apparatus having the wireless LAN device 13 of the embodiment.
(Sport Analysis System)

Figure 2:
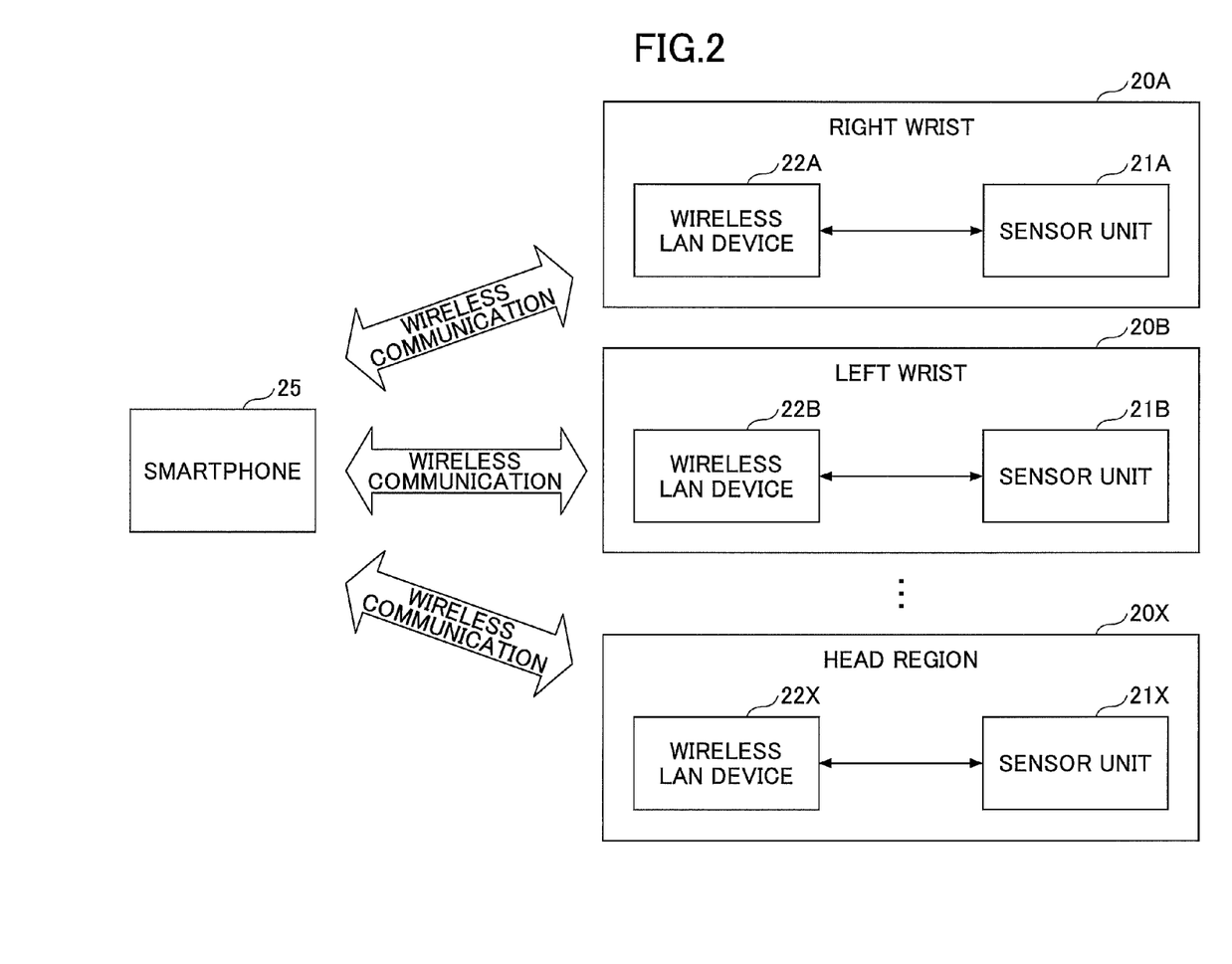
FIG. 2 is a block chart of an embodiment of sport analysis system.

FIG. 2 is a block chart illustrating an exemplary sport (body position) analysis system using the wireless LAN device 13 being a wireless communication device of the embodiment of the present invention. Referring to FIG. 2, sensor units 20A, 20B, . . . , 20X are respectively attached to various portions of a body such as the right wrist, the left wrist, and the head region of a test subject. The sensor units 20A to 20X respectively include sensor units 21A to 21X and wireless LAN devices 22A to 22X.

The wireless LAN devices 22A to 22X are mutually connected to, for example, the smartphone by IBSS, which is an ad hoc mode of the wireless LAN. The smartphone 25 is used as an analysis and display device. Position detection signals output from the sensor units 21A to 21X are supplied to the wireless LAN devices 22A to 22X through an SPI or an I2C, and further supplied from the wireless LAN devices 22A to 22X to the smartphone 25. In the smartphone 25, three dimensional positions of various portions of the body such as the right wrist, the left wrist, and the head region are displayed and a motion of the body of the test subject can be analyzed.

Referring to FIG. 2, the sensor units 20A to 20X are connected to the smartphone 25 according to, for example, the following procedure.

1) Forming an IBSS network: Referring to FIG. 2, when a power switch of the sensor unit 20A is turned on, the mode of the wireless LAN device 22A becomes an intermittent sending and receiving mode and the wireless LAN device 22A sends a beacon.

2) Firstly participating in the IBSS network: The smartphone 25 receives the beacon sent by the wireless LAN device 22A and connects itself to the IBSS network of the wireless LAN device 22A. The wireless LAN device 22A detects the connection of smartphone 25 and transits from the intermittent sending and receiving mode to a steady sending and receiving mode performing a steady sending and receiving process and maintains the steady sending and receiving mode.

3) Firstly preparing data communication: The smartphone 25 sets an IP address. At this time, the wireless LAN device 22A functions as a DHCP server and the smartphone 25 acquires a MAC address of the wireless LAN device 22A.

4) Secondarily participating in the IBSS network: When the power switches of the sensor units 20B to 20X are turned on, the modes of the wireless LAN devices 22A to 22X become a receiving mode and periodically switches over a receiving wireless channel.

5) Secondarily preparing data communication: The smartphone 25 acquires MAC addresses of the wireless LAN devices 22B to 22X. At this time, the smartphone 25 sends a frame for inquiring the MAC address. Then, the wireless LAN devices 22B to 22X send the MAC address of the own to the smartphone 25 in response to the frame for inquiring the MAC address.

6) Data communication: The smartphone 25 performs a data communication with various wireless LAN devices 22A to 22X and acquires position detection information detected by the sensor units 21A to 21X.

7) Disconnection: When the beacon is not received from the smartphone 25 for a predetermined time of period, the wireless LAN device 22A transits to the intermittent sending and receiving mode. When the beacon is not received from the smartphone 25 for a predetermined time of period, the wireless LAN devices 22B to 22X transit to the receiving mode.

The above structure realizes a wireless communication system analyzing the body position of the test subject wearing an apparatus having the wireless LAN device 13 of the embodiment.

In the above system illustrated in FIGS. 1 and 2, various modulation methods and a performance of high speed data communication are not required. Instead, downsizing, a lighter weight, low-power consumption, and a versatility of enabling a connection with an apparatus such as the smartphone are required.

Within the embodiment, extreme downsizing and further low-power consumption are realized in comparison with the conventional wireless LAN device by selecting a modulation method to be used in conformity with the above-mentioned use requiring the downsizing and the low-power consumption and downsizing the receiving circuit accordingly.

<Structure of Wireless LAN Device>

Figure 3:
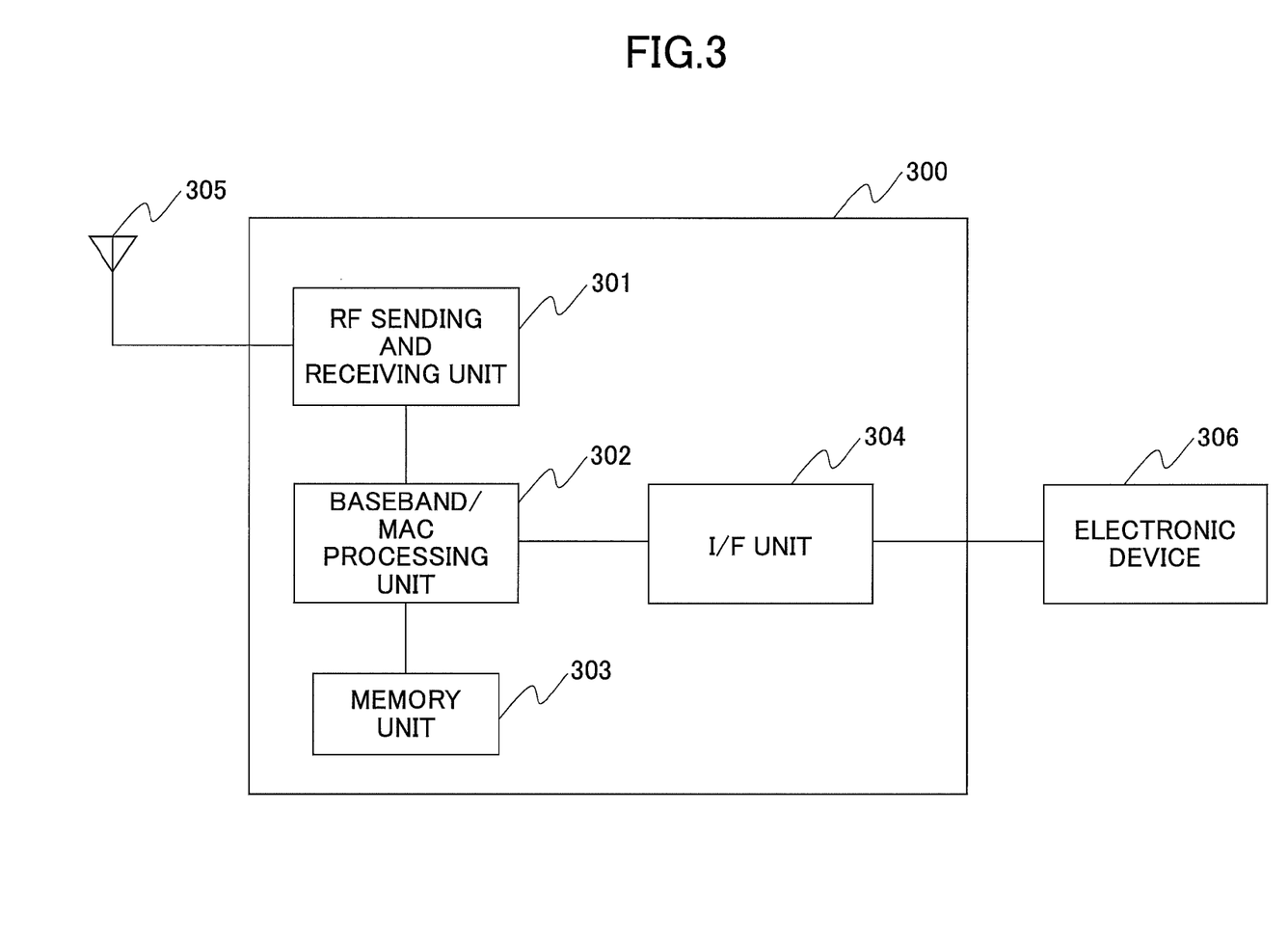
FIG. 3 is a block chart of an embodiment of a wireless LAN device.

FIG. 3 is a block chart of the wireless LAN device of the embodiment. The wireless LAN device 300 may be the wireless LAN device 13 illustrated in FIG. 1 or the wireless LAN device 22A to 22X illustrated in FIG. 2. Referring to FIG. 3, the wireless LAN device 300 includes a radio frequency (RF) sending and receiving unit 301, a baseband media access control (MAC) processing unit 302, a memory unit 303, and an interface (I/F) unit 304.

The RF sending and receiving unit 301 receives a RF signal from an antenna 305 and converts the received signal to the baseband signal, and supplies the converted signal to the baseband/MAC processing unit 302. The baseband/MAC processing unit 302 demodulates the input received signal, extracts the receiving frame (a MAC frame) from a demodulated digital baseband signal, and performs a MAC control (a media access control) based on the extracted MAC frame. Data or the like extracted by the baseband/MAC processing unit 302 are supplied to an electronic device 306 through an interface (I/F) unit 304. The electronic device 306 corresponds to the drive unit 11, the sensor unit 12, 21A to 21X, and so on illustrated in FIGS. 1 and 2.

Further, the detection data or the like supplied from the electronic device 306 are input into the baseband/MAC processing unit 302 through the I/F unit 304. The baseband/MAC processing unit 302 modulates the input detection data or the like by mapping the input detection data into a sending frame and inputs the modulated detection data or the like into the RF sending and receiving unit 301. The RF sending and receiving unit 301 sends the input data after converting the input data to a RF signal through the antenna 305.

<RF Sending and Receiving Unit>

Figure 4:
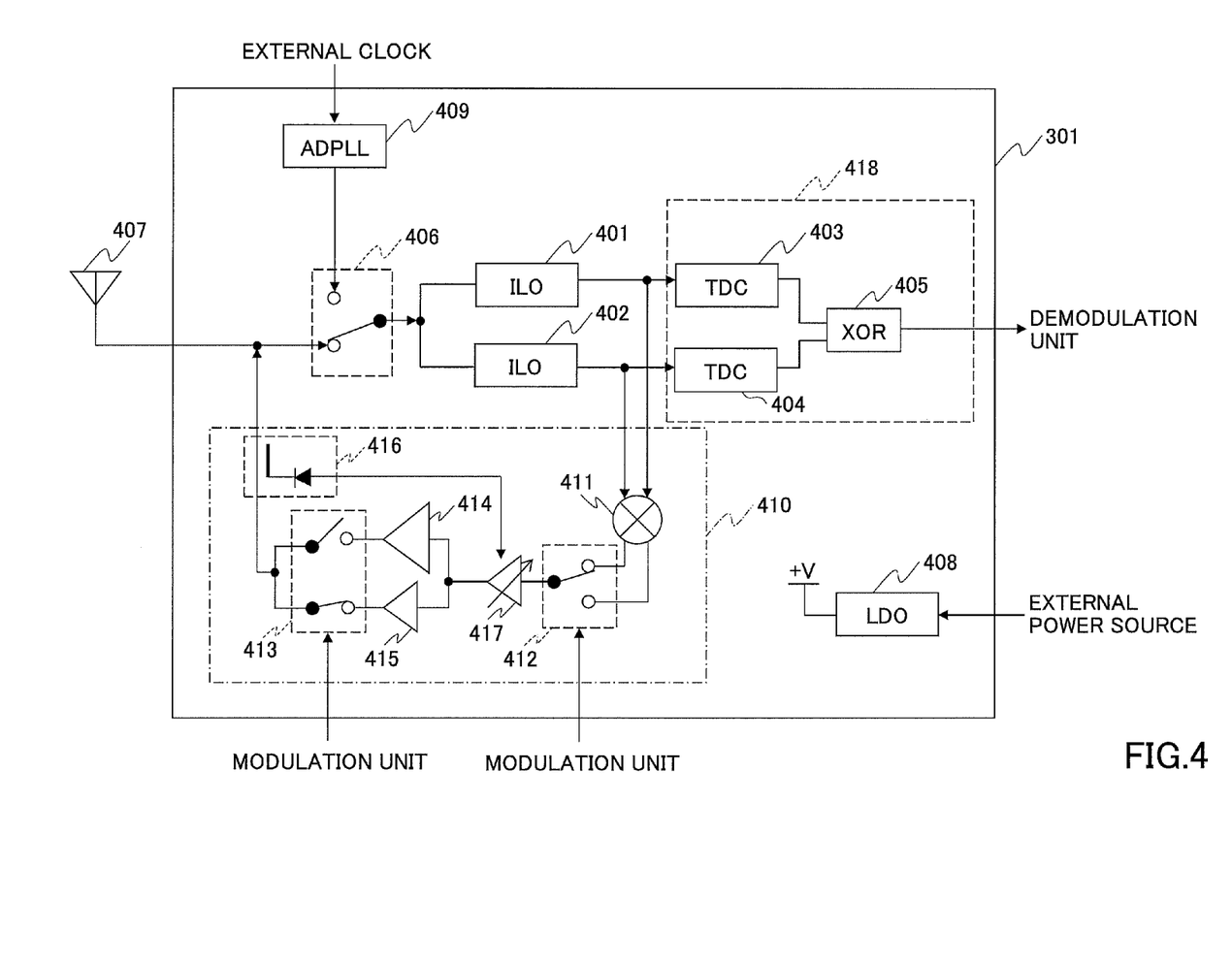
FIG. 4 is a block chart of an embodiment of a sending and receiving unit.

FIG. 4 is a block chart of the sending and receiving unit 301 of the embodiment. The RF sending and receiving unit 301 includes an injection locked oscillator (ILO) 401, an injection locked oscillator (ILO) 402, a phase difference detecting unit 418, a sending unit 410, a RF switch 406, a low drop out (LDO) regulator 408, an all digital phase locked loop (ADPLL) 409, and so on.

The LDO regulator 408 is a power circuit that generates a predetermined voltage from an external power source and supplies the generated voltage into various circuits inside the RF sending and receiving unit 301. The RF switch 406 is a high frequency switch that couples the antenna 407 to the inputs of the IKO 401 and the ILO 402 in receiving the signal and couples the ADPLL to the inputs of the IKO 401 and the ILO 402 in sending the signal.

<Sending Circuit>

Described below is a structure of sending by the sending and receiving unit 301.

The ADPLL 409 is a phase lock oscillator formed by a digital circuit and generates a clock having a predetermined frequency based on an external clock. The output clock of the ADPLL 409 is input into the ILO 401 and the ILO 402 through the RF switch 406 at the time of sending the signal. Output signals of the ILO 401 and the ILO 42 are input into the sending unit 410.

The sending unit 410 includes a mixer 411, a first switch 412, a driver amplifier 417, a first power amplifier 414, a second power amplifier 415, a second switch 413, and a detector 416. The mixer 411 upconverts the frequencies of the output signals of the ILO 401 and the ILO 402 so as to convert to a sending frequency. The first switch 412 switches over to any one of two RF signals that is output from the mixer 411 and has different phases by a control of a modulation unit included in the baseband/MAC processing unit 302.

The driver amplifier 417 is an amplifier that has an automatic power control (APC) function of controlling a gain in response to an output voltage of the detector 416 that detects a sending output and stabilizing the sending output. The first power amplifier 414 is a power amplifier for a high power, and the second power amplifier 415 is a power amplifier for a low power. The modulation unit switches over the second switch 413 in response to the sending output so as to selectively cause an output from the first power amplifier and/or the second power amplifier to occur.

The ADPLL 409, the RF switch 406, the sending unit 410, and so on are an example of the sending circuit of the sending and receiving unit 301. The structure of the sending circuit may be the other structure.

<Receiving Circuit>

Described below is a structure of receiving by the RF sending and receiving unit 301.

Referring to FIG. 4, the receiving circuit includes the ILO 401, the ILO 402, and the phase difference detecting unit 418. Further, the phase difference detecting unit 418 includes a time to digital converter (TDC) 403, a time to digital converter (TDC) 404, and a logical device of exclusive or (XOR) 405. The received signal input from the antenna 407 is input into the ILO 401 and the ILO 402 through the RF switch 406 at the time of receiving the signal.

The ILO 401 is an injection locked oscillator (a first injection locked oscillator) having a free-running frequency whose frequency is offset onto the positive side by, for example, about +1 to +2 MHz with respect to the half frequency of the frequency of the received signal (the RF signal) which is subjected to the BPSK modulation. The ILO 402 is an injection locked oscillator (a second injection locked oscillator) having a free-running frequency whose frequency is offset onto the negative side by, for example, about −1 to −2 MHz with respect to the half frequency of the frequency of the received signal (the RF signal).

Operations of the ILO 401 and the ILO 402 are based on a principal similar to the above-described argument dividers. Said differently, the ILO 401 and the ILO 402 oscillate at a frequency f/2, which is the half frequency of a frequency f of the received signal in synchronism with the frequency of the received signal when the received signal is input (injected). The phase of the output signal of the ILO 401 whose free-running frequency is higher than the frequency f/2 changes from 0 degrees to +90 degrees when the phase of the received signal is changed from 0 degrees to 180 degrees. The phase of the output signal of the ILO 402 whose free-running frequency is lower than the frequency f/2 changes from 0 degrees to −90 degrees when the phase of the received signal is changed from 0 degrees to 180 degrees.

With the above operations, the phases of the output signals of the ILO 401 and the ILO 402 are the same when the phase of the received signal subjected to the BPSK modulation is 0 degrees, and the phases of the output signals of the ILO 401 and the ILO 402 are adverse when the phase of the received signal subjected to the BPSK modulation is 180 degrees. The output signals of the ILO 401 and the ILO 402 are input into the phase difference detecting unit 418.

The TDC 403 (the first time-to-digital converter) of the phase difference detecting unit 418 detects the phase of the output signal of the ILO 401. Further, TDC 404 (the second time-to-digital converter) of the phase difference detecting unit 418 detects the phase of the output signal of the ILO 402. The XOR 405 connected to the outputs of the TDC 403 and the TDC 404 outputs a difference between the phase of the ILO 401 detected by the TDC 403 and the phase of the ILO 402 detected by the TDC 404.

<Injection Locked Oscillator>

The structures of the injection locked oscillators ILO 401 and ILO 402 of the embodiment are described.

Figure 5:
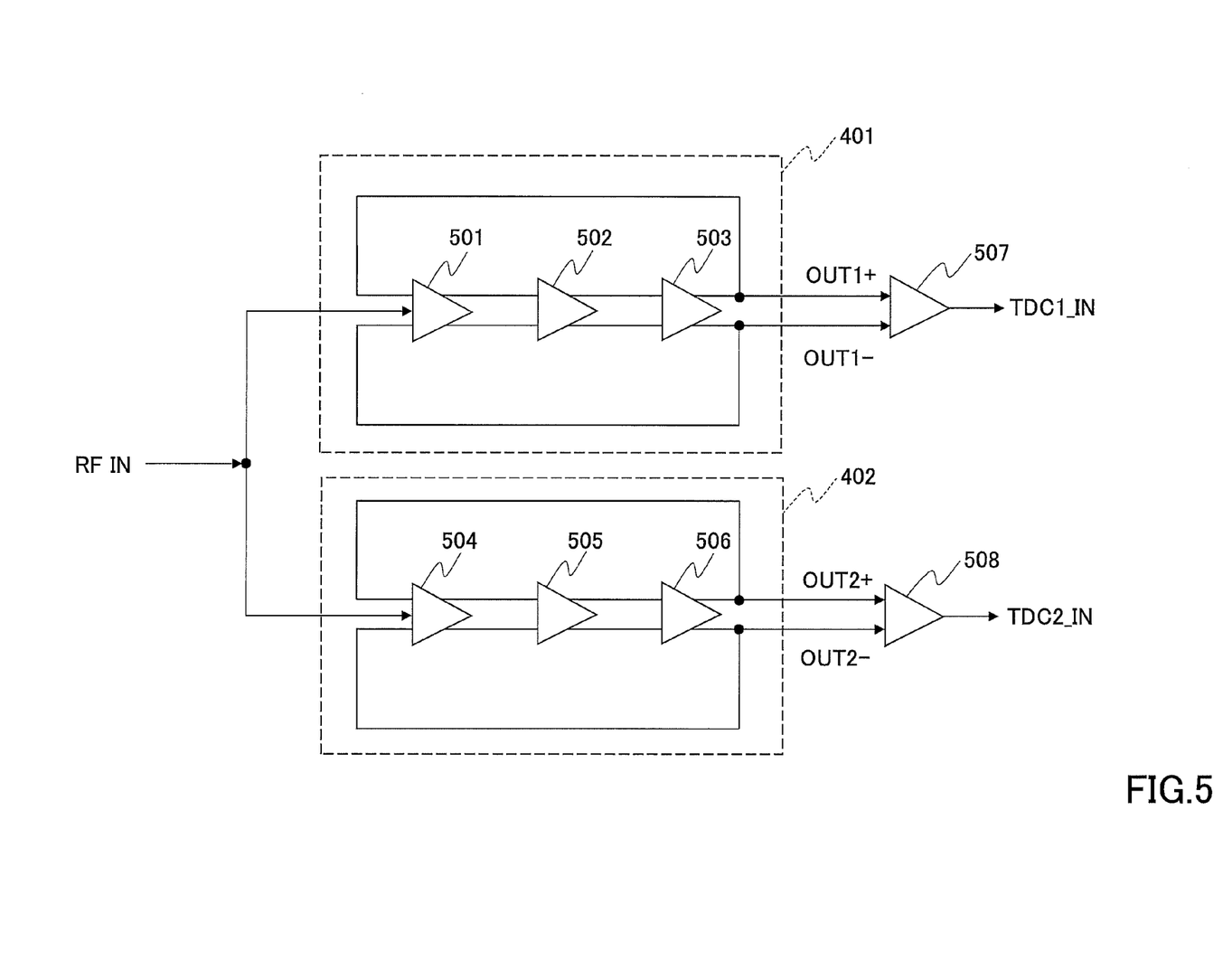
FIG. 5 illustrates a structure of an embodiment of an injection locked oscillator.

FIG. 5 illustrates a structure of the injection locked oscillators ILO 401 and ILO 402 of the embodiment. The ILO 401 is structured to be a ring oscillator, in which delay elements 501, 502, and 503 performing a differential input and output are connected in series and the output signal of the delay element 503 on an output stage is fed back to the input of the delay element 501 on an input stage. The delay elements 501 to 506 are, for example, an inverter or the like. Provided that the reception frequency of the wireless LAN device 300 is f, the free-running frequency $f_{o1}$ of the ring oscillator of the ILO 401 is represented by formula 1, where $\Delta f_1$ is the above-described offset frequency of, for example, about 1 MHz to 2 MHz.

$$f_{o1}=f/2+\Delta f_1 \quad \text{[Formula 1]}$$

The ILO 401 being the injection locked oscillator locks (synchronizes) the frequency to be the input frequency f which is about two times of the free-running frequency $f_{o1}$, and outputs a signal having a frequency f/2 being the half frequency of f. In the ILO 401 having the positive offset frequency, when the phase of the input signal changes 180 degrees, the phase of the output signal changes by +90 degrees.

In a manner similar thereto, the ILO 402 is structured to be a ring oscillator, in which delay elements 504, 505, and 506 performing a differential input and output are connected in series and the output signal of the delay element 506 on an output stage is fed back to the input of the delay element 504 on an input stage. The free-running frequency $f_{o2}$ of the ring oscillator of the ILO 402 is represented by formula 2, where $\Delta f_2$ is the above-described offset frequency of, for example, about 1 MHz to 2 MHz $$f_{o2}=f/2+\Delta f_2 \quad \text{[Formula 2]}$$

The ILO 402 being the injection locked oscillator locks (synchronizes) the frequency to be the input frequency f which is about two times of the free-running frequency $f_{o2}$, and outputs a signal having a frequency f/2 being the half frequency of f. In the ILO 402 having the negative offset frequency, when the phase of the input signal changes 180 degrees, the phase of the output signal changes by −90 degrees (270 degrees).

Within the embodiment, the received signal is assumed to be a signal subjected to a binary phase shift keying (BPSK) modulation in the standard of IEEE802.11. The BPSK indicates two values when the phase is 0 degrees and 180 degrees. When the phase of the received signal is changed from 0 degrees to 180 degrees, the phase of the output signal of the ILO 401 changes by +90 degrees and the phase of the output signal of the ILO 402 changes by −90 degrees. Said differently, when the phase of the received signal changes from 0 degrees to 180 degrees, the phases of the output signals of the ILO 401 and the ILO 402 are reversed.

Here, the offset frequency $\Delta f_1$ of the ILO 401 and the offset frequency $\Delta f_2$ of the ILO 402 are in a relationship of a trade-off relative to a receiving sensitivity. Said differently, when the offset frequencies $\Delta f_1$ and $\Delta f_2$ are low, the receiving sensitivity is good. When the offset frequencies $\Delta f_1$ and $\Delta f_2$ are high, the receiving sensitivity is bad. Further, the channel frequencies of the wireless LAN in 2.4 GHz band are provided with an interval of 5 MHz as follows: 1 ch=2412 MHz; 2 ch=2417 MHz; . . . 13 ch=2472 MHz.

Further, in the receiving circuit of the embodiment, if the frequency f/2 being the half frequency of the reception frequency f exists between $f_{o1}$ and $f_{o2}$, the frequency f/2 is received. In order to prevent more than two wireless LAN channels from being received, it is desirable to properly set the offset frequencies $\Delta f_1$ and $\Delta f_2$.

Further, it is preferable to set the offset frequencies $\Delta f_1$ and $\Delta f_2$ so that $\Delta f_1+\Delta f_2$ include the bandwidth of the wireless LAN signal subjected to the BPSK modulation.

Within the embodiment, values of the offset frequencies $\Delta f_1$ and $\Delta f_2$ are set from 1 MHz to 2 MHz so as to satisfy the above conditions.

Although the values of the offset frequencies $\Delta f_1$ and $\Delta f_2$ are preferably 1 MHz to 2 MHz as above, the values may be other values.

<Phase Difference Detecting Unit>

Figure 6:
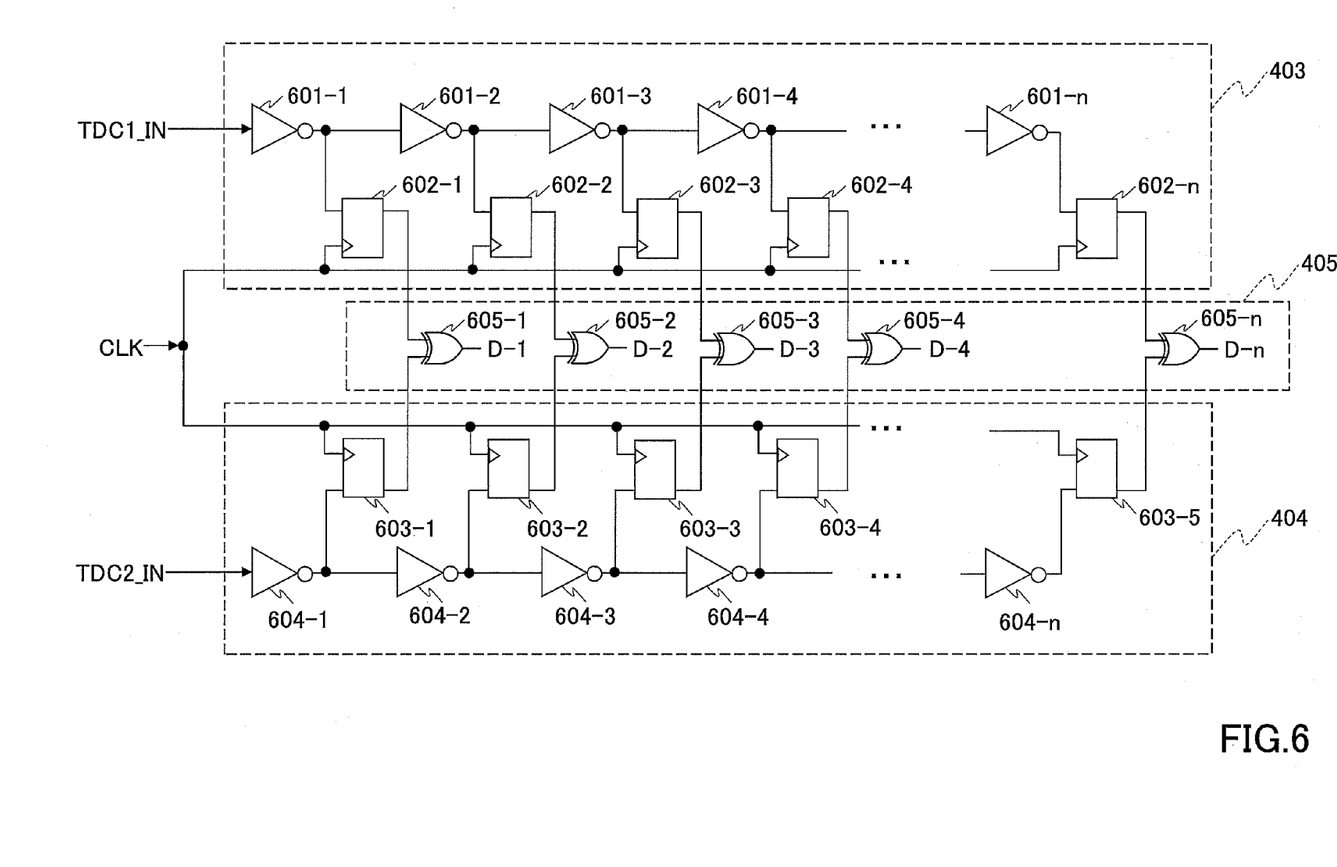
FIG. 6 illustrates a structure of an embodiment of a phase difference detecting unit.

Next, the structures of the time-to-digital converters TDC 403, TDC 404, and TDC 405 are explained. FIG. 6 illustrates the structure of the phase difference detecting unit 418 of the embodiment. The TDC 403 includes delay elements 601-1 to 601-n such as inverters of n-stages connected in series and latch circuits 602-1 to 602-n connected respectively to the outputs of the delay elements 601-1 to 601-n. Within the embodiment, the number n of stages of the delay elements is ten. A clock signal (for example, 22 MHz) is input into the latch circuits 602-1 to 602-n. The latch circuits 602-1 to 602-n latch output values of the corresponding delay elements 601-1 to 601-n and output the output values.

In a manner similar thereto, the TDC 404 (a second time-to-digital converter) includes delay elements 604-1 to 604-n such as inverters of n-stages connected in series and latch circuits 603-1 to 603-n connected respectively to the outputs of the delay elements 604-1 to 604-n. The clock signal is input into the latch circuits 603-1 to 603-n. The latch circuits 604-1 to 604-n latch output values of the corresponding delay elements 604-1 to 604-n and output the output values.

Further, an XOR 405 (an exclusive-or circuit) includes XOR circuits 605-1 to 605-n whose number corresponds to the stage number n of the delay elements. The output values of the TDC 403 and the TDC 404 are input into the XOR circuits 605-1 to 605-n. For example, the output values of the latch circuit 602-n and the latch circuit 603-n are input into, for example, the XOR circuit 605-n. The XOR circuit 605-n outputs a value of exclusive OR of the output values of the latch circuits 602-n and 603-n.

Figure 7:
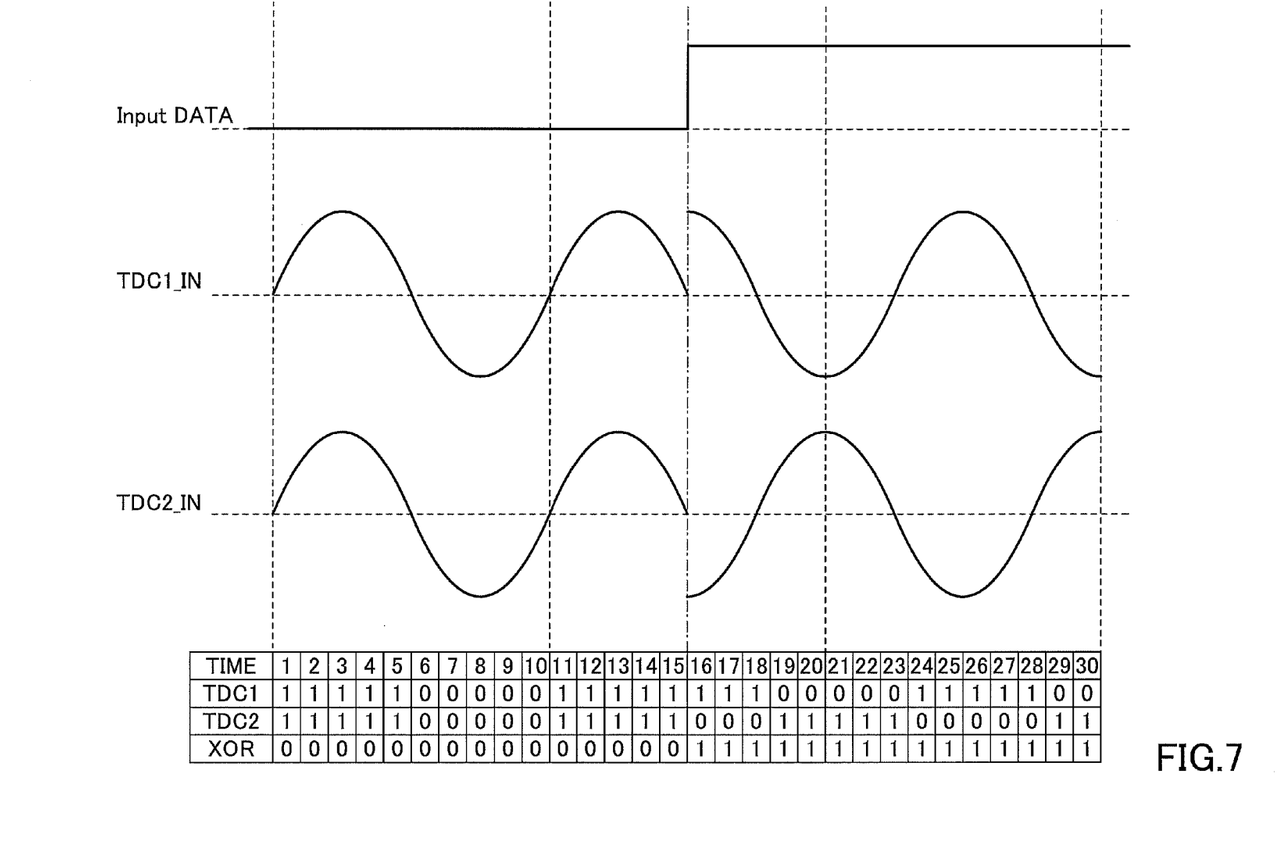
FIG. 7 illustrates an operation of an embodiment of a phase difference detecting unit.

An exemplary operation of the phase difference detecting unit 418 is as follows.

FIG. 7 is a chart for explaining the operation of the phase difference detecting unit 418. Referring to FIG. 7, an Input DATA signal indicates a value (a phase) of the received signal subjected to the BPSK modulation. The phase of the received signal is changed from 0 degrees to 180 degrees at a time 16.

Referring to FIG. 7, a TDC1_IN signal has a waveform input from the ILO 401 to the TDC 403. The value of TDC1 in a table of FIG. 7 indicates output values of the TDC 403 (for example, output values of the latch circuits 602-1 to 602-n). In a manner similar thereto, a TDC2_IN signal has a waveform input from the ILO 402 to the TDC 404. The value of TDC2 in the table of FIG. 7 indicates output values of the TDC 404 (for example, output values of the latch circuits 603-1 to 603-n). Further, the value of XOR in the table indicates the output value of the XOR 405 (for example, D-1 to D-n of FIG. 6).

Referring to FIG. 7, because the phase of the received signal subjected to the BPSK modulation between a time 1 to a time 15 is 0 degrees, there is no phase difference between the output signal TDC1_IN of the ILO 401 and the output signal TDC2_IN of the ILO 402. Therefore, the value of the TDC1 and the value of the TDC2 are the same. Therefore, the value of XOR in the table becomes "0".

Because the phase of the received signal subjected to the BPSK modulation between a time 16 to a time 30 is 180 degrees, the phase of the output signal TDC1_IN of the ILO 401 is +90 degrees and the phase of the output signal TDC2_IN of the ILO 402 is −90 degrees. Therefore, the value of the TDC1 and the value of the TDC2 are not the same. Therefore, the value of XOR in the table becomes "1".

As described above, the output value of the XOR 405 conforms to the change of the phase of the received signal. With the above structure, it is possible to realize a small-sized and low-power consumption BPSK receiving circuit without using structures such as a mixer, a filter, a low nose amplifier (LNA), a voltage controlled oscillator (VCO), or the like.

Although the number of stages of the delay elements is preferably ten, the number may be other than ten.

<Baseband/MAC Processing Unit>

Figure 8:
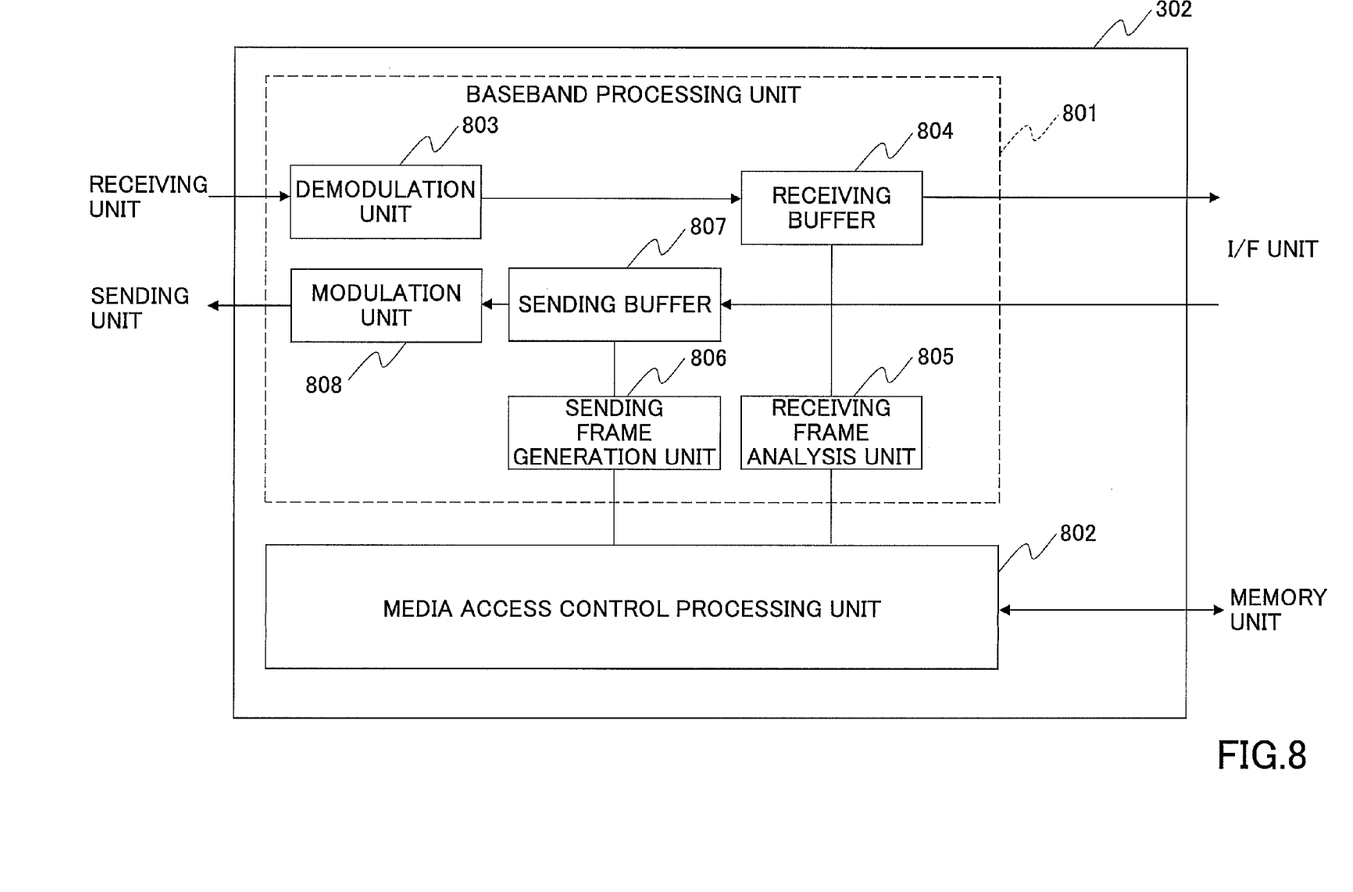
FIG. 8 illustrates a structure of an embodiment of a baseband/MAC processing unit.

FIG. 8 illustrates the structure of the baseband/MAC processing unit of the embodiment. The baseband/MAC processing unit 302 includes, for example, a baseband processing unit 801 and a media access control processing unit 802.

Referring to FIG. 8, the baseband processing unit 801 includes a demodulation unit 803, a receiving buffer 804, a receiving frame analysis unit 805, a sending frame generation unit 806, a sending buffer 807, and a modulation unit 808. The demodulation unit 803 demodulates a signal input from the receiving unit and stores the demodulated data in the receiving buffer 804. The receiving frame analysis unit 805 analyzes the receiving data stored in the receiving buffer 804 and detects the receiving frame (a MAC frame). For example, the MAC frame has a frame format of the wireless LAN communication defined by the standard of IEEE802.11. The sending frame generation unit 806 generates a sending frame (a MAC frame) including sending data and stores the sending frame in the sending buffer 808. The modulation unit 808 causes data stored in the sending buffer 807 to be sent by the sending unit 410.

The MAC processing unit (an access controlling unit) 802 sends and receives a MAC frame using the receiving frame analysis unit 805 and the sending frame generation unit 806 and performs a MAC control (a media access control) of the wireless LAN device 300. The structure of FIG. 8 is an example. The sending frame generation unit 806 and/or the receiving frame analysis unit 805 may be included in the media access control processing unit 802.

With the above structure, it is possible to facilitate downsizing and a low-power consumption in a receiving circuit that receives data subjected to the BPSK modulation defined by the standard of IEEE802.11 at 1 Mbps.

<General Overview>

According to the wireless LAN device 300 of the embodiment, the small sized feature (the downsizing) and the low-power consumption can be realized by the BPSK receiving circuit using the injection locked oscillator (ILO401 and ILO402).

A smaller sized feature (further downsizing) and a lower power consumption can be realized by forming phase difference detecting unit 418 for detecting a phase difference of the output signals of the injection locked oscillator (ILO401 and ILO402) using a digital circuit.

With the above structure, the receiving circuit of the wireless LAN device 300 does not need to include an LNA, a filter, a mixer, a PLL circuit, a VCO, or the like.

Furthermore, because the wireless LAN device 300 of the embodiment having the small sized feature (the downsizing) and the low-power consumption can communicate with an ordinary wireless LAN device, the wireless LAN device 300 can be easily installed in a toy (e.g., a radio control toy) so as to be easily controlled by a smartphone or the like as illustrated in FIG. 1.

In a manner similar thereto, the wireless LAN device 300 may be attached to a possession such as a bicycle, an umbrella, a key, a document, or the like and is connected to a LED, a buzzer, or the like. Thus, an existence check system for checking the existence of the possession or the like by causing the LED, the buzzer, or the like to generate light, sound, or the like can be easily formed.

Further, as illustrated in FIG. 2, the wireless LAN device 300 may be connected with a sensor and the sensor may be attached to a human body so that data of the human body are collected. Thus, the wireless LAN device 300 is suitable for a system by which a posture, a body position, or the like of a person wearing the sensor can be analyzed.

Furthermore, the wireless LAN device 300 is applicable to an information providing system. In this case, the wireless LAN device 300 is arranged in the vicinity of an exhibited object such as a painting or a sculpture, commercial goods, an advertisement, or the like so that related information of the exhibited object, the commercial goods, the advertisement, or the like is browsed by a smartphone or the like. In this case, the name of the exhibited object, the commercial goods, the advertisement, or the like is set to a service set identifier (SSID) reported by the wireless LAN device 300. Here, information to be provided is stored by the memory unit 303 or the like of the wireless LAN device 300. It is preferable to enable an access to the information to be provided by selecting the SSID or the like including the names of the exhibited object, the commercial goods, the advertisement, or the like through an application or the like operated by a smartphone.

In the wireless LAN device 300 of the embodiment, the modulation method for a use requiring the downsizing and the low-power consumption is the BPSK modulation as described above and components such as a LNA, a filter, a mixer, a PLL circuit, a VCO, or the like can be reduced. With this, in comparison with the conventional wireless LAN device, the wireless LAN device 300 realizes drastic downsizing and very low power consumption.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the wireless communication device have been described in detail, it should be understood that the various changes, substitutions, and alterations could be made hereto without departing from the spirit and scope of the invention.

What is claimed is:

1. A wireless communication device comprising:
   a first injection locked oscillator that inputs a received signal and includes a free-running frequency obtained by offsetting a frequency on a plus side relative to a half frequency of a frequency of the received signal;
   a second injection locked oscillator that inputs the received signal, and includes a free-running frequency obtained by offsetting a frequency on a minus side relative to the half frequency of a frequency of the received signal;
   a phase difference detecting unit that includes
      a first time-to-digital converter to which an output signal output from the first injection locked oscillator is input;
      a second time-to-digital converter to which an output signal output from the second injection locked oscillator is input; and
      an exclusive-or circuit that is connected with the first and second time-to-digital converters to output a value of exclusive-or of the output signal from the first injection locked oscillator and the output signal from the second injection locked oscillator, and detects a phase difference between the output signal output from the first injection locked oscillator and the output signal output from the second injection locked oscillator;
   a baseband processing unit that extracts a receiving frame based on the detected phase difference; and
   an access controlling unit that performs a medium access control based on the receiving frame.

2. The wireless communication device according to claim 1,
   wherein the received signal is a signal of a wireless LAN communication provided with a BPSK modification.

3. A wireless communication system for remotely operating an apparatus including the wireless communication device according to claim 1.

4. A wireless communication system for analyzing a body position of a person wearing an apparatus including the wireless communication device according to claim 1.

5. A wireless communication system for checking goods provided with the wireless communication device according to claim 1.

6. A wireless communication system for serving information related to an exhibited object, commercial goods or advertisement, each provided with the wireless communication device according to claim 1.

7. A receiving circuit comprising:
   a first injection locked oscillator that receives a received signal subjected to a BPSK modulation and has a ring oscillator of a free-running frequency obtained by offsetting a frequency on a plus side with respect to a half frequency of a received signal frequency of the received signal;
   a second injection locked oscillator that receives the received signal and has a ring oscillator of a free-running frequency obtained by offsetting a frequency on a minus side with respect to the half frequency of the received signal frequency of the received signal; and
   a phase difference detecting unit that includes
      a first time-to-digital converter to which an output signal output from the first injection locked oscillator is input;
      a second time-to-digital converter to which an output signal output from the second injection locked oscillator is input; and
      an exclusive-or circuit that is connected with the first and second time-to-digital converters to output a value of exclusive-or of the output signal from the first injection locked oscillator and the output signal from the second injection locked oscillator.

* * * * *